United States Patent [19]

Crump

[11] 3,713,197

[45] Jan. 30, 1973

[54] PIN INSERTION HEAD

[75] Inventor: Robert O. Crump, Scottsdale, Ariz.

[73] Assignee: Honeywell Information Systems Inc., Waltham, Mass.

[22] Filed: March 4, 1971

[21] Appl. No.: 140,169

[52] U.S. Cl. ........................................ 29/203 B

[51] Int. Cl. ........................................ H05k 13/04

[58] Field of Search ...........29/203 B, 203 R, 203 H, 29/203 HC, 203 HM, 203 D

[56] References Cited

UNITED STATES PATENTS 3,307,244 3/1907 De Shong........................29/203 BX 3,545,606 12/1970 Bennett.............................29/203 BX

*Primary Examiner*—Thomas H. Eager
*Attorney*—Fred Jacob et al.

[57] ABSTRACT

A pin insertion head receives a plurality of pins from a pin aligning device and inserts the pins into a circuit board. The pin insertion head includes a plurality of slots with each slot having a ball bearing friction device holding the pin into the slot. Each of the slots has a rod mounted therein to contact the stored pin. A pusher block actuates the plurality of rods for insertion of the stored pins into the circuit board.

7 Claims, 6 Drawing Figures

INVENTOR
ROBERT O. CRUMP

INVENTOR
ROBERT O. CRUMP

PIN INSERTION HEAD

THE CROSS REFERENCE TO RELATED APPLICATION

The pin aligning device shown in the present application is disclosed in a U.S. Pat. application Ser. No. 123,361 by Frederick D. Olney Jr. and Robert O. Crump, filed Mar. 11, 1971, entitled Gravity Fed Pin Insertion Device, which is assigned to the same assignee as the present invention.

BACKGROUND OF THE INVENTION

The present invention pertains to a pin insertion head and more particularly to an insertion head which has a plurality of slots each of which received a straight pin from a pin aligning device. The insertion head has a plurality of friction gripping means each of which retains a pin in a corresponding slot until a pusher moves the pins out of the slots.

Modern electronic equipment such as high-speed data processing systems use microcircuits to reduce the physical size of the system and to increase the operating speed and reliability. These microcircuits are built in modules each of which may replace a large number of circuits using discrete circuit components. A plurality of these modules may be mounted on a circuit board and a plurality of these circuit boards mounted in a cabinet. It is often necessary to make electrical connections between modules which are mounted on a given circuit board and to connect modules on one board with modules on another board. One of the most reliable methods of connecting modules on one board with modules on another board is to insert connector pins into the circuit board and to wrap one end of a connecting wire around the end pin and solder the other end of the wire to a connection on a circuit module. Other wires or cables may then be used to connect pins on one circuit board with pins on other circuit boards.

The complexity of the circuits used in the data processing system may require that hundreds of connector pins be used on each of the circuit boards. These pins may be forced by high pressure into the circuit boards at right angles to the surface of the boards. There have been many attempts to develop devices on machines which will rapidly and accurately place these pins at the desired positions of the circuit boards. Some prior art machines use a plurality of pins inserted in a belt which moves past an insertion head. These belts are bulky, inconvenient and expensive. These prior art machines insert only one pin at a time into the boards so that a relatively long time duration is required to insert the hundreds of pins needed in some circuit boards.

The present invention alleviates some of the disadvantages of the prior art machines by disclosing a pin insertion head which can be used in connection with an aligning device to simultaneously insert a plurality of straight pins in a board. The aligning device takes the straight pins and aligns them so that they can be used by the pin insertion head. The pin insertion head receives the aligned pins from the aligning device and then simultaneously inserts a plurality of these pins into the circuit board. If desired this insertion head can also be used to insert a single pin into the circuit board.

It is, therefore, an object of this invention to provide a new and improved pin insertion head.

Another object of this invention is to provide a pin insertion head which receives pins from a pin aligning device and inserts the pins into a board.

A further object of this invention is to provide a pin insertion head which simultaneously receives a plurality of pins from a pin aligning device and then simultaneously inserts a plurality of pins into a board.

Still another object of this invention is to provide a pin insertion head which simultaneously receives a plurality of straight pins from a pin aligning device and then simultaneously inserts a plurality of pins into predetermined locations in a board.

SUMMARY OF THE INVENTION

The foregoing objects are achieved in the instant invention by providing a pin insertion head which receives a plurality of loose straight pins from a pin aligning device. The pin insertion head has a plurality of slots each of which receives a pin from the aligning device. A friction gripping means retains each pin in a slot until a pusher moves the pins out of the slots into an adjacent board.

Other objects and advantages of this invention will become apparent from the following description when taken in connection with the accompanying drawings.

DESCRIPTION OF THE PREFERRED EMBODIMENT

Figures 1, 2, 3:
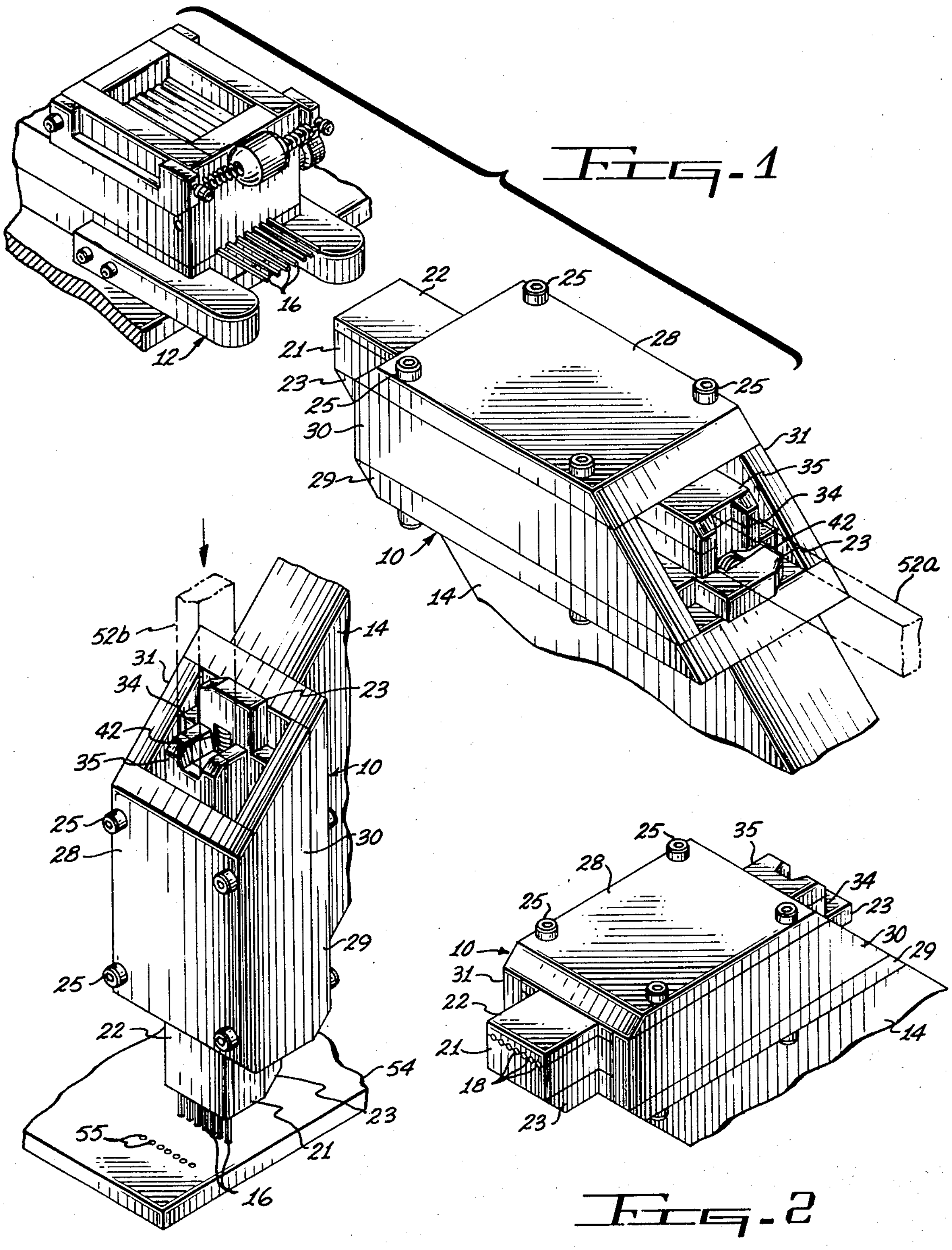
FIG. 1 is an isometric view of a pin aligning device and a pin insertion head embodying the instant invention.
FIG. 2 is an isometric view of the pin insertion head showing the slots in the head.
FIG. 3 is an isometric view of the pin insertion head in position to insert the pins into a board which is adjacent to the head.

Referring now to FIG. 1 there is shown a pin insertion head 10 which is adapted to receive a plurality of straight pins from a pin aligning device 12 and to insert these straight pins into a board. The pin aligning device 12 takes loose straight pins and aligns them ready for use by the pin insertion head. The pin insertion head 10 is mounted on a frame or support 14 which moves the head toward device 12 so that pins 16 are moved from device 12 into slots 18 (shown in FIG. 2) of the head 10. These slots 18 are machined in the holder assembly which includes a holder block 21, a holder cap 22 and a holder plate 23.

Figures 4, 5:
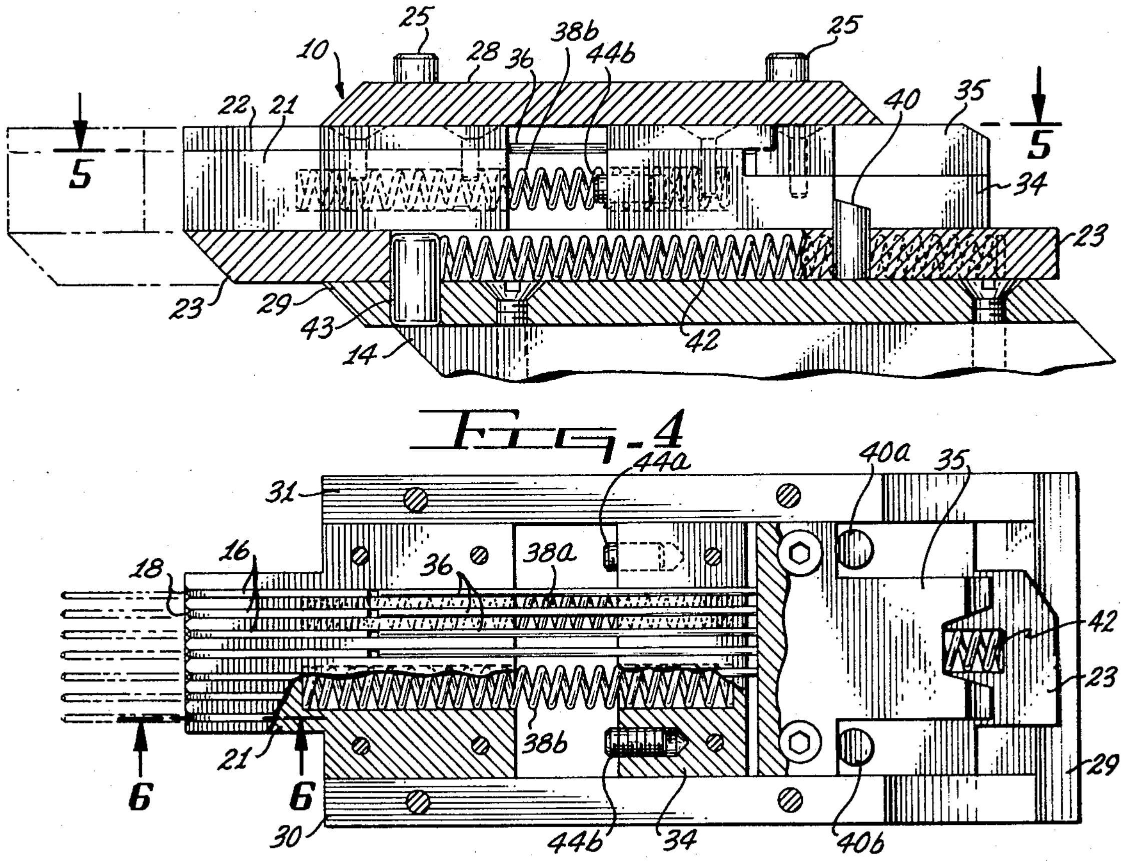
FIG. 4 is a cross sectional view of the pin insertion head shown in FIG. 3.
FIG. 5 is a cross sectional view of the pin insertion head shown in FIG. 4.

The holder assembly is movably mounted inside the body of the insertion head which includes a front plate 28, a back plate 29 and a pair of side plates 30 and 31. A pusher assembly which includes pusher block 34, pusher cap 35 and a plurality of pusher rods 36 is also movably mounted inside the body of the insertion head. Holder plate 23 extends throughout the length of the insertion head as shown in FIGS. 2 and 4. Holder block 21 and holder plate 22 are fixed mounted on one end of the holder plate and the pusher assembly is slidably mounted on the other end of holder plate 23.

Figure 6:
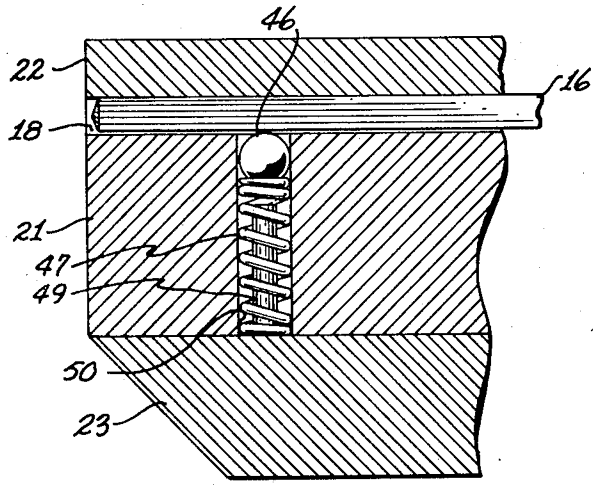
FIG. 6 is a cross sectional view of a portion of the pin insertion head shown in FIG. 5.

Pusher block 34 is biased away from the holder block 21 by a pair of pusher springs 38*a* and 38*b* (FIG. 5). A pair of stops 40*a* and 40*b* mounted on holder plate 23 limit the travel of the pusher block 34. A holder spring 42 and a post 43 bias the holder plate 23 toward the right end of the body of the insertion head 10 as shown in FIG. 4. Post 43 also limits the travel of the holder plate 23 so that the holder plate rests in the position shown in FIGS. 3 and 4 when the actuating rod 52 is not pressed against the pusher block 34. A pair of screws 44*a* and 44*b* are adjustable to limit the minimum distance between holder block 21 and pusher block 34 and thereby limit the distance that rods 36 are moved to the left in the slots (see FIG. 5). When the pins 16 are inserted into the slots 18 of the insertion head 10 a friction means associated with each slot grips the pin and prevents the pin from falling out of the slot while the head is being positioned. The friction means includes a steel ball 46 (FIG. 6) which is biased against the side of the pins 16 by a ball spring 47. A limit rod 49 limits the travel of steel ball 46 and prevents any bent pins from being forced into the well 50.

A sequence of operation will now be described in connection with FIGS. 1–3. Details of the pin insertion head and the method of operation may be seen more clearly by referring to FIGS. 4–6. During the loading operation, support 14 moves the pin insertion head 10 adjacent the pin aligning device 12 so that the pins 16 from the pin aligning device are moved into the ports 18 at the left end of the holder block 21 as shown in FIGS. 1 and 2. These pins 16 are moved into slots 18 to a position adjacent the pusher rods 36 as shown in FIG. 5. The actuating rod 52*a* (FIG. 1) may move the holder block 21 toward the left of head 10 into the position shown by the dashed lines in FIG. 4 to facilitate the loading of pins into the head. A steel ball and spring positioned under each of the slots shown in FIG. 5 provide a friction means for holding the pins 16 in the slots 18 until these pins are moved out of the slots by the pusher rods 36.

When the loading operation is completed support 14 moves the pin insertion head 10 into the position shown in FIG. 3. The holder block 21 is then pressed against the board 54 with the slots 18 adjacent a plurality of holes 55 which have been drilled in the board 54. The actuating rod 52*b* then presses against the pusher block 34 and the pusher cap 35 causing the pusher block, the pusher cap and the pusher rods 36 to move toward the holder block 21. Since holder block 21 is pressed against the board 54 the holder block does not move but the pusher block and the pusher rods are moved toward the left as shown in FIG. 5 thereby shoving the pins 16 out of the slots and into the holes in the board. Screws 44*a* and 44*b* contact the holder block 21 (FIG. 5) to limit the travel of the pusher rods and to limit the distance the pins are moved into the holes in the board. The diameter of the holes is small compared to the width of the pins so that the pins fit snugly in the holes and will remain securely mounted on the board.

When the actuating rod 52b no longer presses against the pusher block 34 and the pusher cap 35 the springs 38*a* and 38*b* cause the pusher block, pusher cap and the pusher rods 36 to again move away from holder block 21 into the position shown in FIG. 5. The pin insertion head 10 can again be moved into the position shown in FIG. 1 and then moved adjacent the pin aligning device 10. Another group of pins can be loaded into the slots 18 ready for insertion into the board 54.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. A pin insertion head for receiving pins from a pin aligning device and for inserting pins into a board, said head comprising:

a holder having a plurality of slots with each slot receiving and storing a pin;

means located in each slot for gripping said pin while the pin is in said slot, said means for gripping being connected to said holder and comprising a spring means and a friction means, said friction means being biased towards said slot by said spring means, said spring means causing said friction means to press against the side of a corresponding pin when said pin is positioned in said slot; and a pusher, said pusher being movable in each slot to move a stored pin out of said slot.

2. A pin insertion head as defined in claim 1 wherein said pusher includes:

a plurality of rods and a pusher block, each of said rods being mounted on said block, each of said rods being movable in an associated one of said slots to move a stored pin out of said slot.

3. A pin insertion head as defined in claim 1 wherein said friction means comprises a ball bearing.

4. A pin insertion head for receiving a plurality of straight pins from a pin aligning device and for inserting pins into predetermined positions in a board, said head comprising:

a holder having a plurality of slots for receiving and storing a plurality of pins;

means for gripping each of said pins while said pins are in said slots, said means for gripping being connected to said holder and comprising a spring means and a friction means, said friction means being biased towards said slot by said spring means, said spring means causing said friction means to press against the side of a corresponding pin when said pin is positioned in said slot; and a plurality of rods, each of said rods being movable in a corresponding one of said slots to move a stored pin out of said slot.

5. A pin insertion head for receiving pins from a pin aligning device and for inserting pins into a board, said head comprising:

A holder having a slot for receiving and storing a pin;

A ball spring, said ball spring being mounted on said holder;

A ball bearing, said bearing being biased toward said slot by said ball spring, said ball spring causing said bearing to press against the side of a pin when said pin is positioned in said slot;

A pusher block;

A rod, said rod being mounted on said block, said rod being movable in said slot to move a stored pin out of said slot; and A pusher spring, said pusher spring being connected between said holder and said block to bias said block away from said holder.

6. A pin insertion head as defined in claim 5 including:

A travel limiting means, said means being connected between said holder and said block to limit the maximum distance between said holder and said block.

7. A pin insertion head as defined in claim 4 wherein said friction means comprises a ball bearing.

* * * * *